United States Patent
Andrei et al.

(10) Patent No.: US 9,964,571 B2
(45) Date of Patent: May 8, 2018

(54) DIRECTIONAL COUPLER

(71) Applicant: Rohde & Schwarz GmbH & Co. KG, Munich (DE)

(72) Inventors: Andreas Andrei, Petershagen (DE); Raimon Göritz, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 371 days.

(21) Appl. No.: 14/889,490

(22) PCT Filed: May 6, 2013

(86) PCT No.: PCT/EP2013/059364
§ 371 (c)(1),
(2) Date: Nov. 6, 2015

(87) PCT Pub. No.: WO2014/180493
PCT Pub. Date: Nov. 13, 2014

(65) Prior Publication Data
US 2016/0091536 A1     Mar. 31, 2016

(51) Int. Cl.
*H01P 5/18* (2006.01)
*G01R 21/00* (2006.01)
*G01R 15/14* (2006.01)
*H03H 7/48* (2006.01)
*H01P 3/08* (2006.01)

(52) U.S. Cl.
CPC ............. *G01R 21/00* (2013.01); *G01R 15/14* (2013.01); *H01P 5/183* (2013.01); *H01P 5/184* (2013.01); *H03H 7/48* (2013.01)

(58) Field of Classification Search
CPC ...................................... H01P 5/18; H01P 3/08

USPC ........................................................ 333/109
See application file for complete search history.

(56) References Cited

U.S. PATENT DOCUMENTS

| 9,059,491 B2 * | 6/2015 | Lim ...................... H01P 1/2039 |
| 9,406,992 B2 * | 8/2016 | Goritz ........................ H01P 5/16 |
| 2002/0113667 A1 | 8/2002 | Tahara et al. |

(Continued)

FOREIGN PATENT DOCUMENTS

| CN | 101308946 B | 10/2012 |
| DE | 102010009227 A1 | 6/2011 |
| WO | 2014/180493 A1 | 11/2014 |

OTHER PUBLICATIONS

Jian-Zhoa Tong et al: "A wide stopband branch-line coupler using defected ground structure", Microwave and Millimeter Wave Technology (ICMMT), 2010 International Conference on, IEEE, Piscataway, NJ, USA, May 8, 2010 (May 8, 2010, pp. 66-69, XP031717509, ISBN 978-1-4244-5705-2.

(Continued)

*Primary Examiner* — Dean Takaoka
(74) *Attorney, Agent, or Firm* — Renaissance IP Law Group, LLP; David A. Crowther

(57) ABSTRACT

A directional coupler is configured to provide a forward and/or a backward signal derived from a high-frequency signal. The directional coupler comprises a coupling element coupled to a main line, wherein the main line is configured to transport the high frequency signal. The directional coupler further comprises a signal line connecting the coupling element to a measuring port. The signal line comprises a defected ground structure inserted between the coupling element and the measuring port.

19 Claims, 9 Drawing Sheets

(56) References Cited

U.S. PATENT DOCUMENTS

2010/0001810 A1 1/2010 Charley et al.
2012/0319797 A1 12/2012 Tamaru

OTHER PUBLICATIONS

L. H. Weng et al: "An Overview on Defected Ground Structure", Progress in Electromagnetics Research B, Jan. 1, 2008 (Jan. 1, 2001), pp. 173-189, XP55053557, Retrieved from the Internet.
Lim Jong-Sik-et al: "Design of 10 dB 90 DEG branch coupler using microstrip line with defected ground structure", Electronics Letters, IEE Stevenage, GB, vol. 36, No. 21, Oct. 12, 2000 (Oct. 12, 2000), pp. 1784-1785, XP006015792, ISSN: 0013-5194, DOI: 10.1049/EL:20001238.
Int'l Search Report for PCT/EP2013/059364.

\* cited by examiner

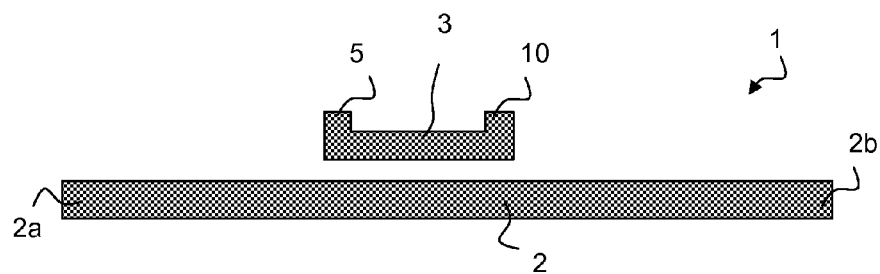
Fig. 1 - Prior Art
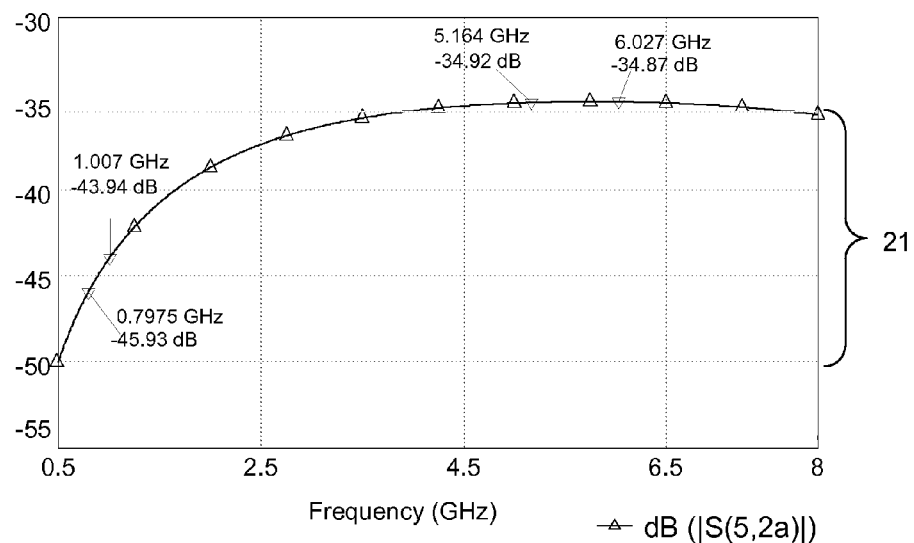
Fig. 2 - Prior Art

DIRECTIONAL COUPLER

CROSS-REFERENCE TO RELATED APPLICATIONS

This application claims the benefit, under 35 U.S.C. § 119(a)-(b) and 35 U.S.C. § 365(a), to International Patent Application No. PCT/EP2013/059364 (published as WO 2014/180493 A1), which is hereby incorporated by reference herein in its entirety.

TECHNICAL FIELD

The present disclosure relates to a directional coupler configured to provide a forward and/or backward signal derived from a high frequency signal.

INTRODUCTION

Disclosed herein are embodiments of methods, apparatus, and systems related to directional couplers, which are passive devices used in high frequency applications. They are used to derive a defined amount of electromagnetic signal power from a main transmission line, which transports a high frequency signal, to a measuring port for analyzing purposes in another circuit. They are constructed from two coupled lines arranged close enough such that the signal transported through the main line is coupled to the coupled line.

Directional couplers are used in numerous applications including: providing a signal sample for measurement or monitoring or feedback or combining feeds to and from antenna or antenna beam forming or providing taps for cable distributed systems or separating transmitted and received signals or identifying mismatching circuits or identifying structural damages in the transmission line and so on.

Patent application DE 10 2010 009 227 A1 describes a directional coupler for measuring power of a forward and/or backward high frequency signal in a coaxial waveguide. That directional coupler comprises a voltage divider coupled to the main line. Since the voltage divider is built with resistors, the directional coupler can be driven with high current loads without using impedance converters.

To compensate the frequency response characteristics of a directional coupler, capacitance elements are used which are galvanically coupled between the coupled line and reference potential of the high frequency signal, especially ground. Disadvantageously, those capacitances can only compensate the frequency response of the directional coupler within a small bandwidth.

To achieve broader bandwidth compensation, so called chip capacitors are used. These chip capacitors are expensive because they have to be bonded and bonding technologies include additional manufacturing steps, like fixing, cleaning, and gilding of a substrate.

It is an objective of the embodiments disclosed herein to reduce the costs of manufacturing directional couplers on the one hand and on the other hand to increase the precision of providing the derived high frequency signals. The directional coupler should have small deviations in the magnitude of the frequency response and high power functionality within a broad frequency bandwidth. The directional coupler should be applicable for monitoring broadband amplifier and EMC applications.

The above-identified objective can be solved especially with a directional coupler configured to provide a forward and/or a backward signal derived from a high frequency signal. The directional coupler comprises a coupling element coupled to a main line, wherein the main line serves for transporting the high frequency signal. The directional coupler comprises a signal line connecting the coupling element to a measuring port for providing the forward and/or backward signal. The signal line of the directional coupler comprises a defected ground structure, wherein the defected ground structure is inserted between the coupling element and the measuring port.

A coupling element may be an element placed close enough to the main transmission line to derive a forward and/or backward signal from the main transmission line.

The main line may be a transmission line comprising a feeding port for feeding a high frequency signal to a tapping port of the main line for tapping the high frequency signal. The main line is a waveguide for transporting a high frequency electromagnetic signal, e.g., a micro strip line, a coplanar line, a substrate integrated waveguide, a slotted line and/or a hollow conductor. The main line is a coaxial waveguide.

A defected ground structure may be built in a metallic ground plane connected to reference potential of the signal line. Such a defected ground structure in the metallic ground plane leads to a disturbance of the shield current distribution in the ground plane caused by the defect in the ground. This disturbance changes the characteristics of the signal line such as line capacitance and line inductance. Any defect in the metallic ground plane of the signal line gives rise to increasing effective capacitance and inductance. A first extension and a second extension increase the route length of current and the effective inductance of the signal line. A non-metallic bar accumulates charge and increases the effective capacitance of the signal line.

The equivalent circuit of a defected ground structure is a parallel RLC resonator circuit, also called oscillating circuit. To insert a defected ground structure into the metallic ground plane of the signal line therefore can electrically be expressed by insertion of a parallel RLC circuit in series in the signal line between the coupling element and the measuring element. According to the frequency response characteristics of the RLC resonator circuit, the frequency response characteristics of the directional coupler is compensated therewith that signals with lower frequencies, e.g., about 100 MHz to about 5 GHz, can be derived from the measuring port without significant deviations, especially lower than about 1 dB, in the magnitude of the frequency response. Since the defected ground structures are easily producible, the manufacturing costs of such a directional coupler are highly reduced when manufactured according to the embodiments disclosed herein.

In one embodiment, the directional coupler further comprises a substrate comprising a first surface and a second surface. The second surface is opposite to the first surface. The signal line is arranged on the first surface and the defective ground structure is built in a metallic ground plane arranged on the second surface of the substrate. The metallic ground plane is connected to a reference potential of the high frequency signal.

The defected ground structure can be placed on the second surface in a manner that a center of the defected ground structure is placed underneath the signal line.

Such an arrangement advantageously leads to a band stop filter structure for compensation of the frequency response of the directional coupler. Since frequencies below 5 GHz are strongly affected with high transmission losses of the derived high frequency signal at the measuring port, the filter characteristics of such a defected ground structure compensates the frequency response of the directional coupler.

In one embodiment, a resistor element is arranged in the defected ground structure. The resistor element comprises a first contact pin galvanically coupled to a first metallic extension of the defected ground structure. The resistor element further comprises a second contact pin galvanically coupled to a second metallic extension of the defected ground structure. The first metallic extension and the second metallic extension are separated via a non-metallic bar of the defected ground structure.

The insertion of a resistor element as described above electrically leads to a parallel circuit of the resistor element and the parasitic resistor of the RLC-resonator. Since the resistor values of the arranged resistor element is low compared to the parasitic resistor, the insertion of a resistor element advantageously reduces the quality factor of the equivalent circuit of the parallel RLC-resonator of the defected ground structure. The reduction of the quality factor of the oscillator circuit leads to a smoother frequency response gradient of the RLC-resonator and therefore to a better compensation of the frequency response. Therefore, the defected ground structure affects the frequency response characteristics in a broader bandwidth and thus leads to a broader frequency compensation of the directional coupler.

The directional coupler comprises, in one embodiment, a resistor element. The resistor element is arranged on the first surface of the substrate. Therefore, the resistor element comprises a first contact pin galvanically coupled to the signal line and the resistor element. A second contact pin is galvanically coupled to the reference potential of the high frequency signal.

By placing the resistor element in the described manner, a transformation of the resistance occurs, leading to a parallel RLC-resonator in parallel with the resistor element. The above-identified technical effects of smoothing the frequency response characteristics of the equivalent RLC-resonator also apply within such an arrangement.

Because the signal line may be built on a first surface and the defected ground structure may be built on a second surface of the substrate, the insertion of a resistor element on the first surface instead of the second surface of the substrate advantageously leads to decrease of manufacturing costs, particularly since no fixing, no gilding and/or no bonding of the second surface of the substrate of the directional coupler is necessary.

A second resistor element is arranged, in one embodiment, on the first surface of the substrate and the second resistor element comprises a first contact pin galvanically coupled to the signal line and the second resistor element comprises a second contact pin galvanically coupled to the reference potential of the high-frequency signal.

The second resistor may be arranged on a first side of the signal line on the first surface of the substrate, wherein the second resistor is arranged on an opposite second side of the signal line on the first surface of the substrate. This advantageously leads to a symmetrically loaded signal line which provides a better high-frequency shielding of the derived high-frequency signal.

The signal line further comprises, in one embodiment, a second defected ground structure, wherein the second defected ground structure is inserted between the defected ground structure and the measuring port. The use of a second defected ground structure advantegously leads to a better frequency compensation.

A capacitor element is arranged in the defected ground structure, in one embodiment. The capacitance element may comprise a first contact pin galvanically coupled to a first metallic extension of the defected ground structure and a second contact pin galvanically coupled to a second metallic extension of the defected ground structure, wherein the first metallic extension and the second metallic extension of the defected ground structure are separated via a non-metallic bar of the defected ground structure. The arrangement of the capacitance element in such a manner advantageously leads to a galvanic coupling of the capacitance element in parallel to the equivalent RLC-resonator circuit. This leads to an influence of the resonation frequency of this oscillating circuit. Therefore, the frequency compensation of the frequency response is adjustable and improved.

A capacitance element is arranged, in one embodiment, on the first surface of the substrate and the capacitance element comprising a first contact pin galvanically coupled to the signal line. The capacitance element comprises a second contact pin galvanically coupled to the reference potential of the high frequency signal.

Like the resistance element, the capacitor element can also be arranged on the first surface of the substrate of the directional coupler. As described above, fixing, gilding, and bonding manufacturing steps on the second surface of the substrate can be avoided, leading to a reduction of manufacturing costs.

A second capacitance element can be arranged on the first surface of the substrate, in one embodiment. The second capacitance element comprises a first contact pin galvanically coupled to the signal line. The second capacitance element comprises a second contact pin galvanically coupled to the reference potential of the high frequency signal.

The capacitance element may be arranged on a first side of the signal line on the first surface of the substrate wherein the second capacitance element is arranged on an opposite second side of the signal line on the first surface of the substrate. This advantageously leads to a symmetrically loaded signal line which provides a better high-frequency shielding of the derived high-frequency signal.

The signal line further comprises, in one embodiment, an inductance element galvanically coupled in series between the coupling element and the measuring port. The insertion of an inductance element is electrically interpreted as a series RLC-resonant circuit. This series resonant circuit advantageously has a frequency response characteristic as a high pass filter. Choosing the resonant frequency of this series RLC-resonator high above the maximum derived electromagnetic signal frequency, the frequency response of the directional couplers measuring port is further improved.

Advantageously the signal line further comprises a second inductance element arranged in series to the inductance element. This leads to a second series RLC-resonator. By choosing different inductance values for the inductance element and the second inductance element, two high-pass filters are obtained for further influencing and compensating the frequency response characteristics. Preferably the ratio of the first inductance element and the second inductance element is in the range between about 1:2 and about 1:10, most preferably at about 1:5.

For further improving the frequency compensation, a frequency-trimming element can be inserted in the signal line of the directional coupler.

In one embodiment, the capacitance element, the second capacitance element, the inductance element, the second inductance element and/or the trimming element are arranged as conductive path elements build on the first surface of the substrate, e.g., as micro strip elements. This drastically reduces the costs of manufacturing the directional coupler.

The directional coupler further comprises, in one embodiment, a second signal line connecting the coupling element to a second measuring port for providing the forward and/or backward signal. The second signal line comprises a defected ground structure, wherein the defected ground structure is inserted between the coupling element and the second measuring port. Advantageously, the directional coupler can provide forward and backward signals.

In an alternative solution, the directional coupler comprises a second coupling element and a second signal line for connecting the second coupling element to a second measuring port for providing the forward and/or backward signal. The second signal line comprises a defected ground structure, wherein the defected ground structure is inserted between the second coupling element and the second measuring port.

Advantageously, the first measuring port is configured to provide the forward signal wave, wherein the second measuring port is configured to provide the backward signal wave. Additionally, each coupling element comprises a termination port, wherein the termination port is terminated with a matching termination element.

BRIEF DESCRIPTION OF THE DRAWINGS

The written disclosure herein describes illustrative embodiments that are non-limiting and non-exhaustive. Reference is made to certain of such illustrative embodiments that are depicted in the figures, as listed below.

FIG. 1 shows a directional coupler according to a prior art configuration.

FIG. 2 shows the frequency response of the directional coupler according to FIG. 1.

FIG. 4b is a top view of a first surface of the directional coupler according to FIG. 4a.

FIG. 4c is a top view of a second surface of the directional coupler according to FIG. 4a.

FIG. 5 is a top view of another embodiment of the second surface of the directional coupler according to FIG. 4a.

FIG. 6 is a top view of another embodiment of the second surface of the directional coupler according to FIG. 4a.

FIG. 9 is a top view of an alternative first surface of the inventive directional coupler according to FIG. 4a.

FIG. 10 is a top view of another alternative first surface of the inventive directional coupler according to FIG. 4a.

FIG. 11 is a top view of another alternative first surface of the inventive directional coupler according to FIG. 4a.

DETAILED DESCRIPTION

Figure 3A:
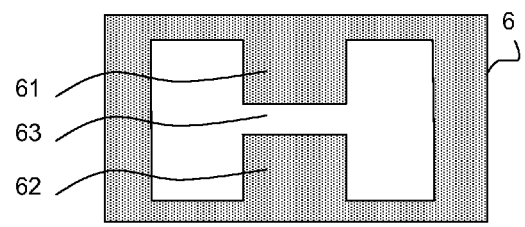
FIG. 3a-3d show defected ground structures according to one embodiment and its electrical equivalent circuit.

With reference to the above-listed drawings, this section describes particular embodiments and their detailed construction and operation. The embodiments described herein are merely examples, set forth by way of illustration only and not limitation. Those skilled in the art will recognize in light of the teachings herein that there are alternatives, variations and equivalents to the example embodiments described herein. For example, other embodiments are readily possible, variations can be made to the embodiments described herein, and there may be equivalents to the components, parts, or steps that make up the described embodiments.

FIG. 1 shows the functional principle of a directional coupler according to a prior-art configuration. A main transmission line 2 comprises a feeding port 2a for feeding a high frequency signal and a tapping port 2b for tapping the high frequency signal. To monitor or measure the high frequency signal via main line 2, which is transported, a coupling element 3 is placed near the main line 2 to derive a defined amount of the signal. The coupling element 3 comprises a measuring port 5 and a second measuring port 10 to provide the derived signal to another circuitry. Such an arrangement might be used when a signal generator or transmitter feeds a signal to the main line and another circuit, e.g., an antenna.

Disadvantageously, such directional couplers are normally tuned to high-frequency signals with a defined small frequency bandwidth. In FIG. 2, the magnitude of the scattering parameter from measuring port 5 to feeding port 2a according to a directional coupler of FIG. 1, hereinafter called S (5,2a), is illustrated from 500 MHz to 8 GHz. The transmission loss 21 between 500 MHz and 8 GHz deviates between 50 dB and 34 dB. As can be seen from FIG. 2, the S-parameter S (5,2a) is only linear in a very small bandwidth from 5-6 GHz.

Especially in the frequency band from 500 MHz to 5 GHz the frequency response of the directional coupler 1 is highly non-linear. Such a directional coupler 1 according to FIG. 1 cannot be used for broadband high frequency applications without a compensation of the frequency response.

Figure 3B:
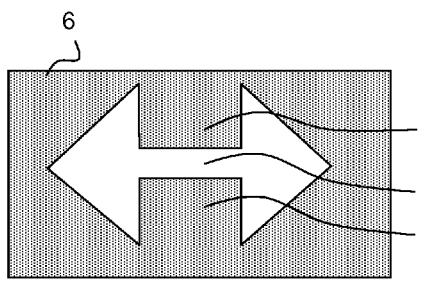
Figure 3C:
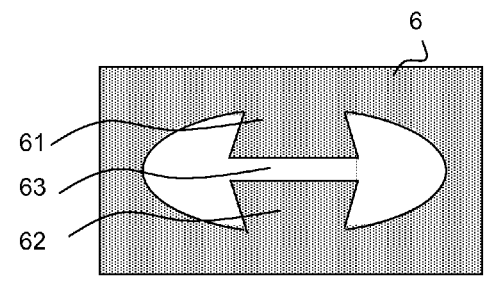

A compensation of the frequency response according to the embodiments disclosed herein can be achieved by defected ground structures (DGS) 6. In FIGS. 3a-3c, different DGS 6 are illustrated. DGS 6 comprises a first metallic extension 61 and second metallic extension 62. The first extension 61 is separated from the second extension 62 by a non-metallic bar 63.

Since in high-frequency applications a metallic ground plane is arranged on a second surface 72 of a substrate 7 for RF-shielding purposes, the DGS 6 can easily be built by removing areas of the ground plane, e.g., through chemical etching or electrolytic etching methods.

FIGS. 3b and 3c show different embodiments of a DGS 6. Not shown but not excluded from the scope of the invention are arrangements of micro strip, coplanar etc. transmission lines.

Figure 3D:
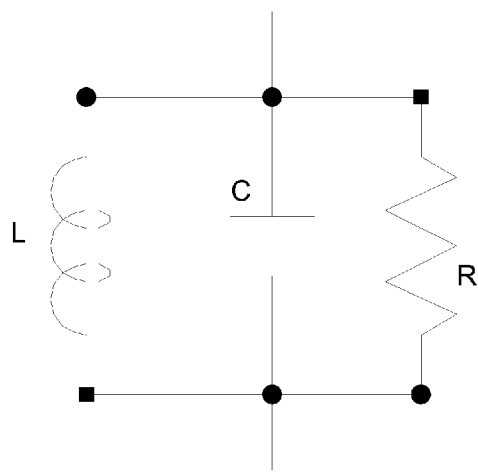

In FIG. 3d an electrically equivalent circuit of a DGS is shown. The equivalent circuit of a DGS can be seen as a parallel RLC-resonator circuit comprising an inductor L, a capacitor C, and a resistor R.

Any defect in the metallic ground plane of the signal line 4 changes the characteristics of that signal line 4 and gives rise to increasing effective capacitance C and inductance L of the signal line 4. The first extension 61 and the second extension 62 increase the route length of current and the effective inductance L. The larger the extensions, the higher the effective inductance L becomes, which leads to a higher cut-off frequency of the RLC-resonator and vice versa. The non-metallic bar 63 accumulates charge and increases the effective capacitance C of the signal line 4. In case the non-metallic bar 63 decreases in its width, the effective capacitance C increases and vice versa.

Figure 4A:
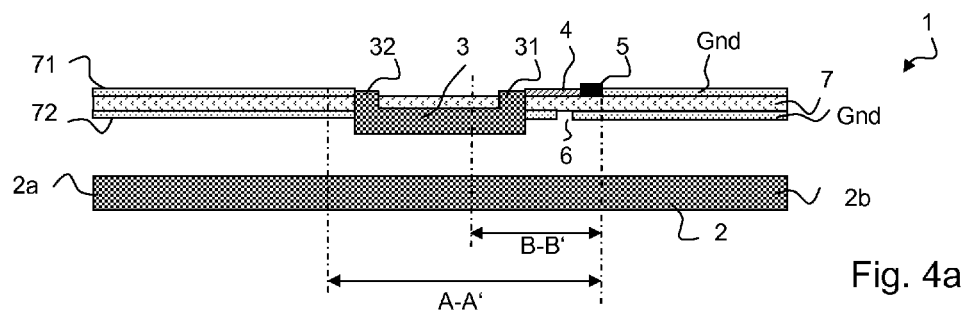
FIG. 4a shows a cross-section of an embodiment of the directional coupler.

In FIG. 4a, a cross-section of a directional coupler 1 is shown. The directional coupler 1 comprises a main line 2. The main line 2 comprises a feeding port 2a and a tapping port 2b. Since the directional coupler 1 can be used in both directions, the feeding port 2a and the tapping port 2b can be interchanged. The main line 2 may be is a coaxial waveguide with an inner conductor surrounded by air with a specific dielectric constant ∈r=1. Such a main line 2 is able to transport broadband signals without high transmission losses. Other types of main lines are not excluded here.

The directional coupler 1 according to FIG. 4a further comprises a coupling element 3. The coupling element 3 is arranged on a second surface 72 of a substrate 7 of the directional coupler 1. This second surface 72 is face to face with the main line 2. The substrate 7 further comprises a first surface 71 which is opposite to the second surface 72 of the substrate 7. The coupling element 3 has a first connection pin 31 and a second connection pin 32 on the first surface 71 of the substrate 7. The connection pins 31 and 32 are integral elements of the coupling element 3.

The coupling element 3 according to FIG. 4a is placed close to the main line 2 to derive a forward and/or backward signal from the transported high frequency signal of the main line 2.

The directional coupler 1 has four ports. A feeding port 2a is the input port where the signal to be transported is applied. The measuring port 5 is the coupled port where a defined portion of the signal applied to the feeding port 2a appears. The tapping port 2b is the transmitted port where the signal from feeding port 2a is output.

The directional coupler 1 may be symmetric. Thus, there also exists an isolated port, which is not shown in FIG. 4a. A defined portion of the signal applied to the tapping port 2a will be coupled to the isolating port. However, the directional coupler 1 is not normally used in this mode, and the isolated port is usually terminated with a matching load 13. This termination is typically arranged on the first surface 71 of the substrate and is therefore not accessible to the user. Effectively, this results in a three-port directional coupler 1.

According to FIG. 4a, the directional coupler 1 comprises a signal line 4 to connect the coupling element 3 via the connection pin 31 to a measuring port 5. Beneath the signal line 4 a DGS 6, according to FIG. 3, is arranged on the second surface 72 of the substrate 7. The first surface 71 and the second surface 72 of the substrate also comprise a ground plane GND between the arranged components for RF shielding purposes. The ground plane of the first surface 71 is not shown in FIG. 4a.

Figure 4B:
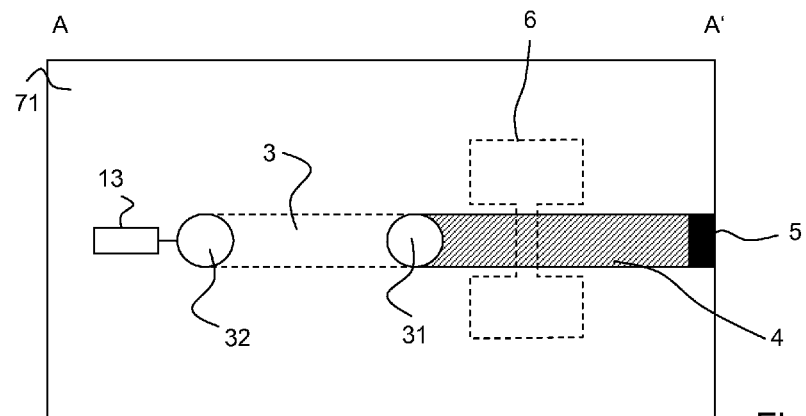

FIG. 4b illustrates a top view of a first surface 71 of a substrate according to intersection line A-A' of FIG. 4a. Elements which are placed on the second surface of the directional coupler are shown in dotted lines; see for instance the coupling element 3 and the DGS 6. The first connection pin 31 and the second connection pin 32 of the coupling element 3 are arranged on a first surface 71 of the substrate 7 of directional coupler 1. The connection pin 32 is terminated with a termination element 13 being the above described matching load, e.g., an impedance of 50Ω. The connection pin 31 is connected to the signal line 4. Therefore, the signal line 4 connects the coupling element 3 and the measuring port 5. The signal line 4 in this embodiment is a micro strip line and according to one embodiment comprises a DGS 6 built on the second surfaces 72 of the directional coupler 1.

Figure 4C:
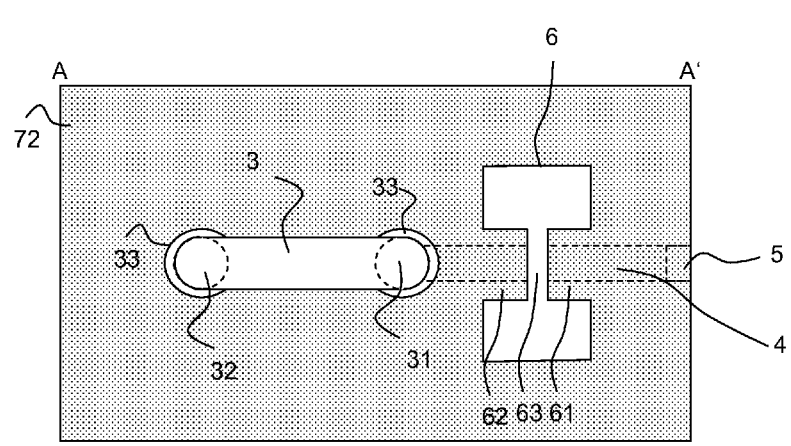

In FIG. 4c, a top view of a second surface 72 of the substrate 7 of the directional coupler 1 at intersection line A-A' is illustrated. As shown, the coupling element 3 and the defected ground structure 6 are arranged on the second surface 72. The defected ground structure 6 comprises a first extension 61 and a second extension 62 of a conductive material, especially of a metallic material. Advantageously the first extension 61 and the second extension 62 are part of a ground plane, as illustrated with specific texture in FIG. 4c. For explanation purposes, the signal line 4 and the measuring port 5 are shown in dotted lines.

The DGS 6 in the metallic ground plane of the micro strip signal line 4 changes the characteristics of the signal line 4 and gives rise to increasing effective capacitance and inductance of a signal line. Since the signal line 4 has a parallel equivalent circuit according to FIG. 3d in its signal path, this RLC-resonator circuit in series in the signal path has the characteristic of a band stop filter. It therefore compensates the frequency response of the S-Parameter S (5,2a) shown in FIG. 2.

Figure 5:
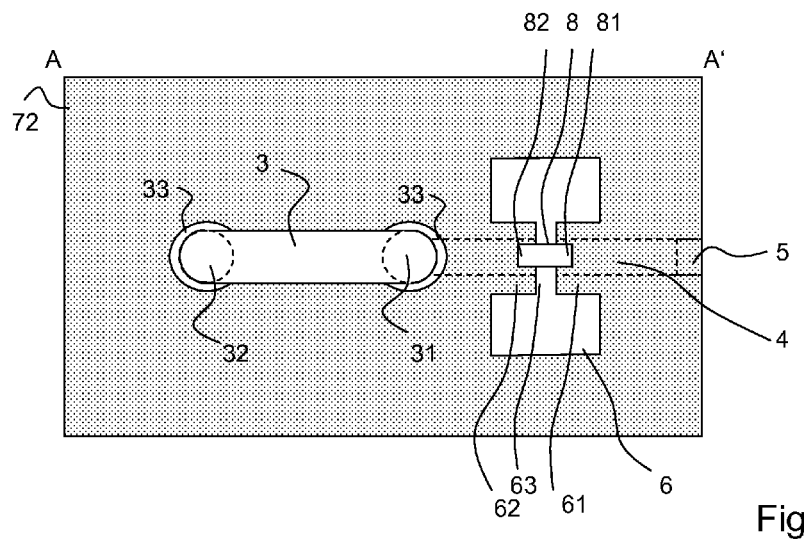

In FIG. 5, a top view of an alternative embodiment of the second surface 72 of the directional coupler 1 according to FIG. 4a is shown. Advantageously the DGS 6 further comprises a resistor element 8. A first pin 81 of the resistor element 8 is connected to the first extension 61 of the defected ground structure 6. A second connection pin 82 of the resistor 8 is connected to a second extension 62 of the defected ground structure 6. This resistor element is arranged as a discrete element. Preferably the resistor element 8 crosses the non-metallic bar 63 of the DGS 6. The value of resistance of the resistor element 8 is for instance 100Ω. This resistor element 8 is inserted for reducing the quality factor of the defected ground structure 6. This is achieved by arranging the resistor element 8 in parallel to the electrically equivalent RLC-resonator circuit. This arrangement of a resistor parallel to the electrically equivalent RLC-resonator circuit leads to a lowering of the high-resistive parasitic resistor value R according to FIG. 3d, since a parallel connection of the high-resistive parasitic resistors R and the low-resistive resistor element 8 leads to a total resistance lower than the low-resistive resistor element 8, e.g., lower than 100Ω. Lowering the Q-factor leads to smoother frequency response gradients in the resulting equivalent RLC-circuit. Therefore the compensation of the frequency response is improved.

Figure 7:
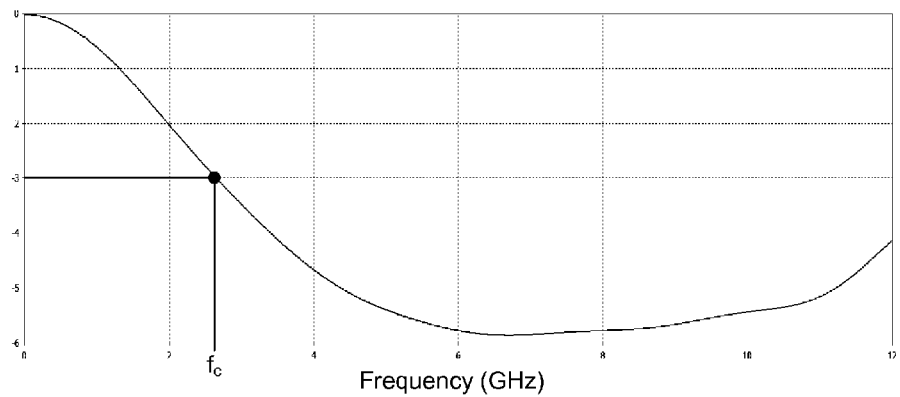
FIG. 7 shows a frequency response of a defected ground structure with a resistor element.

In FIG. 7, the resulting frequency response of a DGS 6 with a parallel resistor element 8 according to FIG. 5 is shown. The resistor element 8 has a value of 100Ω, resulting in a total resistance of the equivalent RLC-resonator of less than 100Ω. As can be seen in FIG. 7, the frequency response of such an DGS 6 with 100Ω resistor element 8 in parallel has the behavior of a low pass filter with a 3-dB cut-off frequency $f_c$=2.6 GHz. Thus, the frequencies from 1 GHz to 3 GHz are passed with less deviation in the transmission loss characteristic than the frequency above 3 GHz. This leads to a higher linearity of the frequency response.

Figure 8:
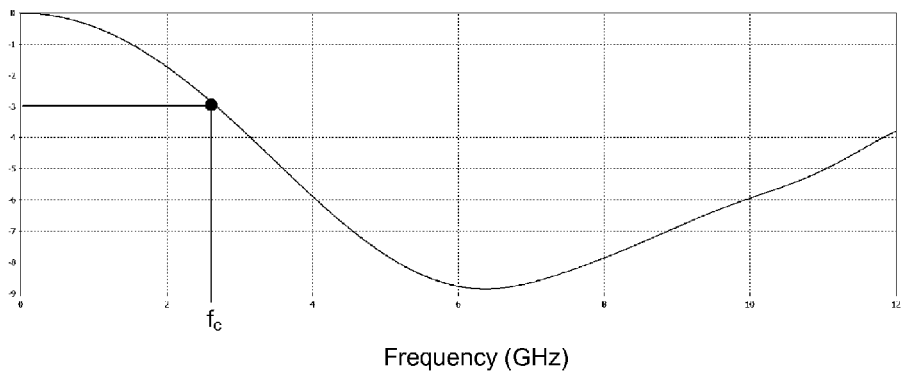
FIG. 8 shows a frequency response of a defected ground structure with a resistor element according to FIG. 7.

In FIG. 8 an alternative frequency response according to FIG. 7 is shown. The DGS 6 according to FIG. 8 comprises a resistor element 8 with a resistive value of 180Ω. As can be seen in FIG. 8, the frequency response of such an DGS 6 with 180Ω resistor element 8 in parallel has the behavior of a low pass filter with a 3-dB cut-off frequency $f_c$=2.5 GHz. Furthermore this resistor element with 180Ω leads to an increasing frequency response at frequencies above 8 GHz. In comparison with FIG. 2, a higher linearity of the frequency response is achieved using a 180Ω resistor element 8.

Figure 6:
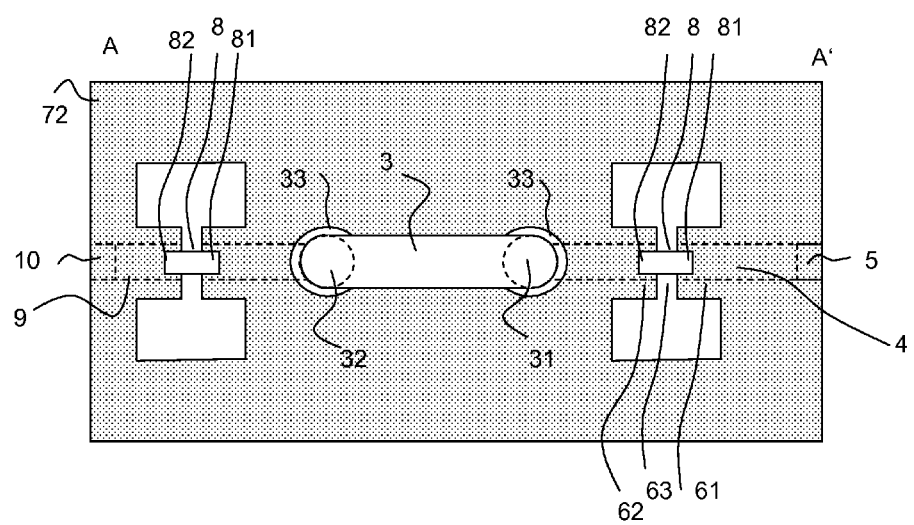

In FIG. 6, a top view of an alternative second surface 72 of the directional coupler 1 according to FIG. 4a is shown. In contrast to the above provided explanations on directional couplers, the isolating port in FIG. 6 is not terminated directly on the substrate 7 leading to inaccessibility for a user. In contrast, FIG. 6 shows an inventive directional coupler 1 with a first measuring port 5 and a second measuring port 10.

This is to provide a directional coupler 1 which does not have to be turned to provide the forward signal and the backward signal to another circuit. Since the above described directional coupler 1 has only one measuring port 5 wherein the isolating port is terminated permanently, the directional coupler 1 can either measure the forward signal or by turning the directional coupler at 180 degrees of a horizontal axis measure the backward signal derived of the transported high frequency signal.

In some arrangements such a 180-degree turning is impossible or highly inconvenient. Also it might be difficult to obtain a coupling behavior between coupling element 3 and main line 2. Therefore, the directional coupler 1 according to FIG. 6 comprises a second measuring port 10 and a second signal line 19 in the second surface 72. Basically the first measuring port 5 and the second measuring port 10 are built equivalently. In case of providing a forward signal of a high frequency signal transported via main line 2 and applied to feeding port 2a of the directional coupler 1, the second measuring port 10 is terminated via a matching terminal element 13.

Accordingly, measuring point 5 now provides the forward signal derived from the applied signal. Additionally, the directional coupler 1 can be used in a reciprocal manner. Therefore, the measuring port 5 is terminated via termination element and the backward signal is provided on the second measuring port 10. The directional coupler 1 does not need to be turned. The coupling element 3 stays coupled to the main line 2.

The embodiment depicted in FIGS. 5 and 6 shows resistor elements 8 arranged on the second surface 72 of the substrate 7. Because the second surface does not comprise other bonded or soldered elements, the second surface 72 is normally not gilded. In light of the objective to manufacture the directional coupler 1 at low cost, it is advantageously suggested to arrange the resistor elements 8 on the first surface 71 of the substrate 7.

Figure 9:
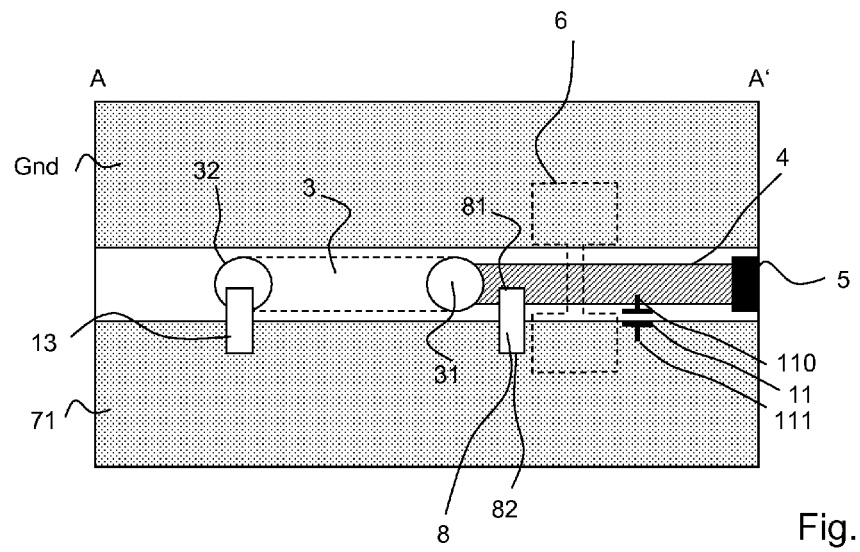

Therefore, FIG. 9 shows a resistor element 8 arranged on the first surface 71 of the directional coupler 1. The resistor element 8 is connected via a first contact pin 81 to the signal line 4. The resistor 8 is connected via second connecting pin 82 to the reference potential ground. Since a ground plane GND is also build on the first surface 71 the connection of the second connection pin 82 of the resistor 8 can be achieved without additional vias or additional transmission lines.

The resistance value R of the resistor element 8 according to FIG. 9 has to be transformed and recalculated to obtain a parallel resistor element with a value of 180Ω according to FIG. 5, FIG. 6, and FIG. 8.

FIG. 9 shows a top view of an alternative first surface 71 of the directional coupler 1. FIG. 9 shows a capacitance element 11 arranged in parallel to the resistor element 8. Therefore, a first connection pin 110 of the capacitance element 11 is connected to the signal line 4. Additionally, the second connection pin 111 of the capacitance element 11 is connected to ground potential GND. This capacitance element 11 further compensates the frequency response of the directional coupler 1.

Disadvantageous gilding of the second surface 72 and expensive bonding for arranging resistor element 8 and capacitance element 11 on the second substrate 72 can therefore be avoided.

Furthermore the coupling element 3 comprises a second connection port 32. This second connection port 32 is terminated via termination element 13. Advantageously determination element 13 comprises a value matching with the impedance of the main line 2, for instance 50 Ω.

Figure 10:
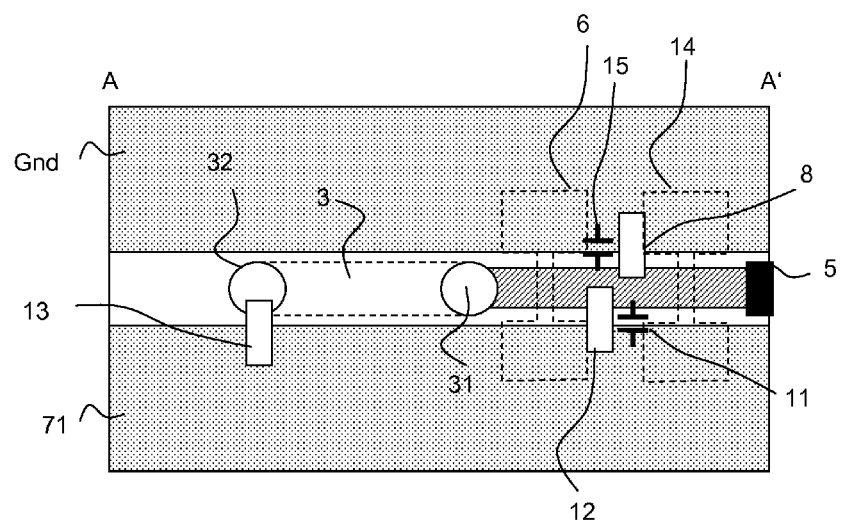

FIG. 10 shows a top view of an alternative first surface 71 of the inventive directional coupler. In contrast to FIG. 9, the directional coupler 1 of FIG. 10 comprises a DGS 6 and a second DGS 14. The cascading of DGS leads to an inclination of depth and bandwidth of the band stop filter characteristics of the equivalent LRC-resonator. Therefore further compensation of the frequency response of the directional coupler 1 according to FIG. 2 is achieved.

A further difference between FIG. 10 and FIG. 9 is the insertion of a second resistor element 12. According to FIG. 10, the resistor 8 is galvanically coupled with a first connection pin 81 on a first side of the signal line 4 and with a second connection pin 82 to ground potential GND. The second resistor element 12 is galvanically coupled with a first connection pin 81 to an opposite second side of the signal line 4 and with a second connection pin 82 to ground potential GND. This leads to a symmetric current loading of the signal line 4 and therefore improves the transmission characteristics of the signal line 4. The resistance values of the resistor element 8 and the resistor element 14 are equal and total resistance of the resistor element 8 and the resistor element 14 is equal to the transformed resistance value to obtain a parallel resistance value of approximately R=180Ω in the RLC-resonator circuit according to FIG. 3d. To further improve the directional couplers frequency response, the total resistance value R of the resistor element 8 and the second resistor element 12 should be lower than about 130Ω and ideally R is about 120 Ω.

Respectively, a second capacitance element 15 is galvanically coupled to a first side of the signal line 4, wherein the capacitance element 11 is galvanically coupled to the second side of the signal line 4. This improves the transmission characteristics of signal line 4. To further improve the directional couplers frequency response the total capacitance value C of the capacitance element 11 and the second capacitance element 15 should be lower than about 1 pF and ideally C is about 0.2 pF.

Since the first surface 71 comprises a ground plane GND no additional vias or transmission lines are necessary to galvanically couple the resistor elements 8, 12 or the capacitance elements 11, 15 to the ground potential GND.

Figure 11:
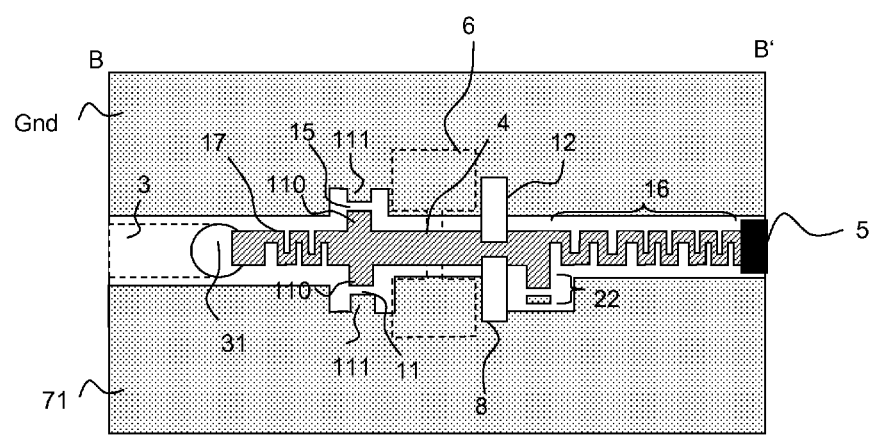

In FIG. 11, a top view of another alternative first surface of the inventive directional coupler 1 according to FIG. 4a at intersection line B-B' is shown. In FIG. 11 the first resistor element 8 and the second resistor element 12 are arranged according to FIG. 10 for symmetric current loading. The first capacitor element 11 and the second capacitor element 15 are arranged as conductive path capacitance elements instead of discrete elements according to FIG. 10. Therefore the first connection pin 110 of the capacitance element 11 is built as a stud of the signal line 4. The second connection pin 111 of the capacitance element 11 is built as a stud of the ground plane. Accordingly, the first connection pin 110 of the second capacitance element 15 is built as a stud of the signal line 4. The second connection pin 111 of the second capacitance element 15 is built as a stud of the ground plane. The total capacitance value of the capacitance element 11 and the second capacitance element 15 should be lower than about 1 pF and ideally C is about 0.2 pF.

An inductance element 16 is arranged in series in the signal line 4 between the measuring port 5 and the resistor elements 8 and 14. The inductance element is arranged as conductive path inductance. Alternatively the inductance element 16 can be arranged as a discrete element. The inductance element 16 builds another LRC-resonator circuit for further compensation of the frequency response. The LRC-resonator with inductance element 16 has the electrical equivalent characteristics of a high pass filter with a cut-off frequency of more than 20 GHz. This leads to an improvement of the transmission characteristics of the derived high frequency signal.

A second inductance element 17 is arranged in series in the signal line 4 between the resistor elements 8 and 14 and the coupling element 3. The second inductance element 17 is arranged as conductive path inductance. Alternatively, the second inductance element 17 can be arranged as a discrete element. The second inductance element 17 builds another LRC-resonator circuit for further compensation of the frequency response. The second inductance element 17 has a five-times higher inductance value than the inductance element 16. Therewith two different high passes with different cut-off frequencies are achieved to compensate the frequency response.

Alternatively, and not shown in FIG. 11, the second inductance element 17 is arranged in series in the signal line 4 between the measuring port 5 and the inductance element 16. The inductance element 16 has an inductance value of L=3.55 nH. The second inductance element 17 has an inductance value of L=1.56 nH.

Additionally, the embodiment of FIG. 11 further comprises a frequency trimming element 22. This trimming element is built as a conductive path element and comprises a conductive stud on the signal line 4 and an unconnected stud of conductive path. The trimming element 22 can be adjusted in two ways. In case the conductive stud on the signal line 4 is too short to obtain a correct compensation of the frequency response, the stud is lengthened with the unconnected stud by a conductive bridge. In case the conductive stud on the signal line 4 is too long to obtain a correct compensation of the frequency response, the stud may be shortened by a cutting tool. With such a trimming element the compensation can be achieved very precisely and in a low cost manner. Alternatively, a varicap can be inserted as a trimming element.

Manufacturing costs can be drastically reduced by building the inductance elements 16, 17, the capacitance elements 11, 15 and the trimming element 22 as conductive paths on the first surface 71 of the directional coupler 1.

Figure 12:
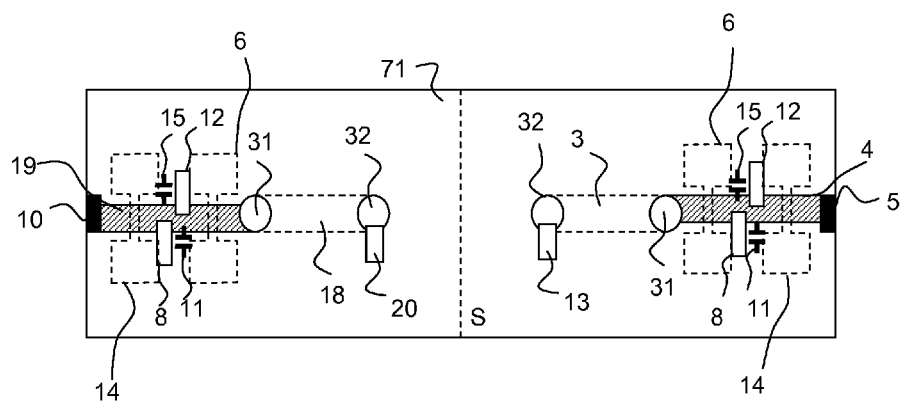
FIG. 12 is a top view of a first surface of an alternative directional coupler.

In FIG. 12, a top view of a first surface 71 of an alternative inventive directional coupler 1 is shown. The directional coupler 1 according to FIG. 12 comprises a second coupling element 18. The directional coupler 1 according to FIG. 12 is built with mirror symmetry, shown through dotted line S. The coupling element 3 and the second coupling element 18 are built in a similar manner.

Both coupling elements 3 and 18 comprise a connection port 32 that is terminated via termination element 13 or 20. The connection port 31 of the coupling element 3 is connected to a measuring port 5. The connection port 31 of the second coupling element 18 is connected to a measuring port 10. The connections to the respective measuring ports 5 or 10 are realized with signal line 4 or 19 and are built equivalently. All the features described in above FIGS. 3-10 are applicable to the embodiment shown in FIG. 12.

In FIG. 12, a directional coupler 1 is shown which provides a forward signal and a backward signal of the high frequency signal transported through the main line 2. Therefore, two coupling elements 3 and 18 are arranged within the directional coupler 1. Since both coupling elements 3 and 18 are terminated on second connection port 32, the forward signal and the backward signal can be directly derived from the high frequency signal without electromagnetic influences between each other. As a result, a highly precise directional coupler with low manufacturing costs is achieved. Since all elements are arranged on the first surface 71 of the directional coupler 1, no gilding or bonding of the second surface 72 of the substrate 7 of the directional coupler 1 is needed.

Figure 13:
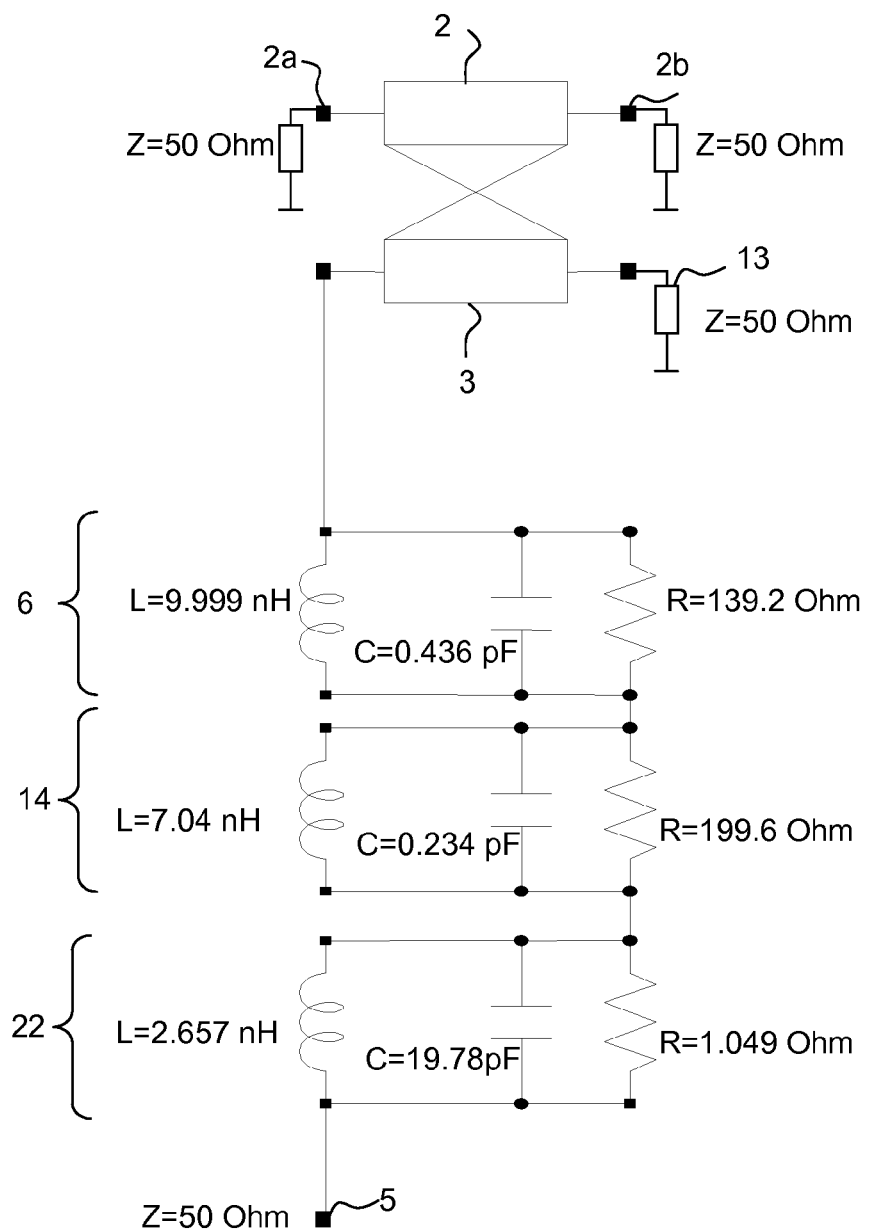
FIG. 13 shows an electrical equivalent circuit of the embodiment of a directional coupler according to FIG. 11.

In FIG. 13, an equivalent circuit is shown of a directional coupler 1 according to the preceding FIGS. 4-12. A main line 2 transports a high frequency signal from the feeding port 2a to the tapping port 2b. The coupling element 3 derives a backward signal from the fed signal and provides the derived signal on measuring port 5. In case the signal is applied to port 2b instead, a forward signal can be derived and provided at measuring port 5.

A termination element 13 is placed on the isolated port of the coupling element 3. The coupling element 3 comprises a signal line 4 and a measuring port 5. The signal line 4 comprises a first parallel RLC-resonator circuit which represents the DGS 6. As can be seen, the resistor element of the equivalent circuit of DGS 6 has a resistance value of R=140Ω which is achieved with resistor element 8 and/or second resistor 12. In series to the parallel RLC-resonator of DGS 6, a second parallel RLC-resonator circuit representing the second DGS 14 is inserted in the signal line 4. Also, the resistor element R of the second DGS 14 is lowered via a parallel resistor element. Finally, the trimming element 22 as well as inductance elements 16, 17 and capacitor elements 11 and 15 are represented by a third parallel RLC-resonator circuit.

Figure 14:
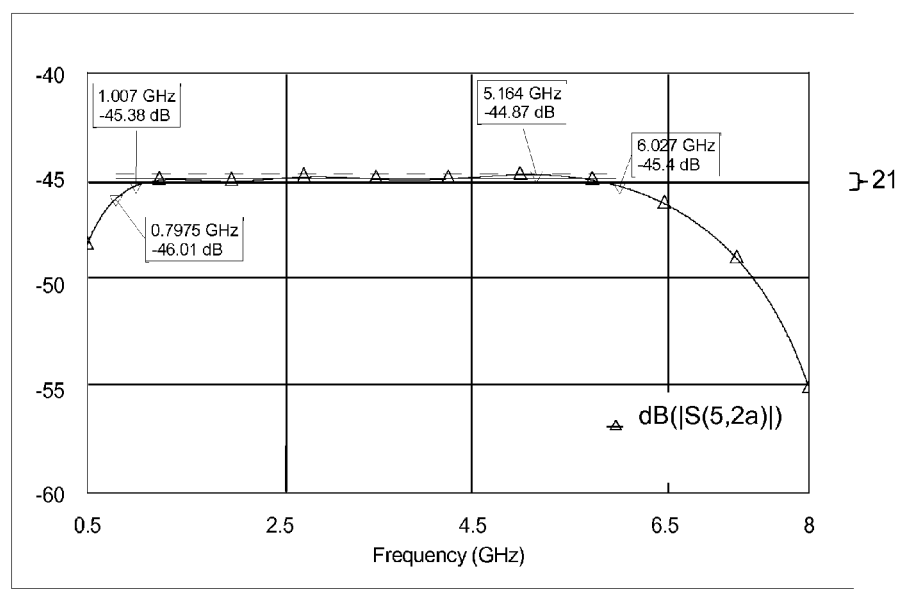
FIG. 14 shows the frequency response of a compensated directional coupler.

In FIG. 14 a frequency response of the compensated directional coupler 1 according to the invention is shown. As an electrical model the equivalent circuit of FIG. 13 is used. As can easily be obtained, the deviation 21 in the frequency response of the magnitude of the S-Parameter S (5,2a) is highly decreased in the frequency band of 500 MHz to 6 GHz.

The directional coupler 1 achieves a deviation 21 in the frequency response of the magnitude of the S-Parameter S (5,2a) of less than 0.6 dB in a frequency band from 800 MHz to 6 GHz. The deviation 21 in the frequency response of the magnitude of the S-Parameter S (5,2a) is less than 0.4 dB in a frequency band from 800 MHz to 3 GHz and also in a frequency band from 2.5 GHz to 6 GHz.

The described directional coupler 1 can be used in signal-generation or signal-amplification applications with transmission power signals higher 800 W.

The invention is not restricted to the exemplary embodiments shown and described. Accordingly, the coils described can also be used for other applications in which a high power-carrying capacity and a high bandwidth are important. Switches with several different paths can also be manufactured with the use of the coils according to the invention. It will be understood by those having skill in the art that changes may be made to the details of the above-described embodiments without departing from the underlying principles presented herein. For example, any suitable combination of various embodiments, or the features thereof, is contemplated.

References to approximations are made throughout this specification, such as by use of the terms "about" or "approximately." For each such reference, it is to be understood that, in some embodiments, the value, feature, or characteristic may be specified without approximation. For example, where qualifiers such as "about," "substantially," and "generally" are used, these terms include within their scope the qualified words in the absence of their qualifiers. For example, where the term about 120Ω is recited with respect to a feature, it is understood that in further embodiments, the feature can have a precise measurement of 120 Ω.

Reference throughout this specification to "an embodiment" or "the embodiment" means that a particular feature, structure or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, as the following claims reflect, inventive aspects lie in a combination of fewer than all features of any single foregoing disclosed embodiment.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the preceding claims up to and including claim [x]," where the bracketed term "[x]" is replaced with the number of the most recently recited independent claim. For example, for the first claim set that begins with independent claim 1, claim 3 can depend from either of claims 1 and 2, with these separate dependencies yielding two distinct embodiments; claim 4 can depend from any one of claim 1, 2, or 3, with these separate dependencies yielding three distinct embodiments; claim 5 can depend from any one of claim 1, 2, 3, or 4, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed in accordance with 35 U.S.C. § 112(f). Embodiments of the invention in which an exclusive property or privilege is claimed are defined as follows.

The invention claimed is:

1. A directional coupler for providing a forward or a backward signal derived from a high-frequency signal, the directional coupler comprising:
    a coupling element coupled to a main line, which transports the high-frequency signal; and
    a signal line connecting the coupling element to a measuring port to provide the forward or backward signal;
    wherein the signal line further comprises a defected ground structure; and
    wherein the defected ground structure is inserted between the coupling element and the measuring port.

2. A directional coupler as recited in claim 1, further comprising:
    a substrate comprising a first surface and a second surface, wherein the signal line is arranged on the first surface, and wherein the defected ground structure is build in a metallic plane arranged on the second surface.

3. A directional coupler as recited in claim 2,
    wherein the metallic plane is connected to a reference potential of the high-frequency signal;
    wherein a resistor element is arranged in the defected ground structure, the resistor element comprising a first contact pin coupled to a first metallic extension of the defected ground structure and a second contact pin coupled to a second metallic extension of the defected ground structure; and
    wherein the first metallic extension and the second metallic extension of the defected ground structure are separated via a non-metallic bar of the defected ground structure.

4. A directional coupler as recited in claim 2,
    wherein the metallic plane is connected to a reference potential of the high-frequency signal; and
    wherein a resistor element is arranged on the first surface of the substrate and the resistor element comprising a first contact pin coupled to the signal line and the resistor element comprising a second contact pin coupled to the reference potential of the high-frequency signal.

5. A directional coupler as recited in claim 4, wherein a second resistor element is arranged on the first surface of the substrate and the second resistor element comprises a first contact pin coupled to the signal line and the second resistor element comprising a second contact pin coupled to the reference potential of the high-frequency signal.

6. A directional coupler as recited in claim 2,
    wherein a capacitance element is arranged in the defected ground structure, the capacitance element comprising a first contact pin coupled to a first metallic extension of the defected ground structure and a second contact pin coupled to a second metallic extension of the defected ground structure; and
    wherein the first metallic extension and the second metallic extension of the defected ground structure are separated via a non-metallic bar of the defected ground structure.

7. A directional coupler as recited in claim 2, wherein a capacitance element is arranged on the first surface of the substrate, the capacitance element comprises a first contact pin coupled to the signal line and the capacitance element comprises a second contact pin coupled to a reference potential of the high-frequency signal.

8. A directional coupler as recited in claim 7, wherein a second capacitance element is arranged on the first surface of the substrate, the second capacitance element comprises a first contact pin coupled to the signal line and the second capacitance element comprises a second contact pin coupled to the reference potential of the high-frequency signal.

9. A directional coupler as recited in claim 1, wherein the signal line further comprises a second defected ground structure and wherein the second defected ground structure is inserted between the defected ground structure and the measuring port.

10. A directional coupler as recited in claim 1, wherein the signal line further comprises an inductance element arranged in series between the coupling element and the measuring port.

11. A directional coupler as recited in claim 10, wherein the signal line further comprises a second inductance element arranged in series to the inductance element.

12. A directional coupler as recited in claim 11, wherein an inductance ratio of the inductance element and the second inductance element is in the range between about 1:2 and about 1:10.

13. A directional coupler as recited in claim 1, wherein the signal line further comprises a frequency trimming element coupled in series between the coupling element and the measuring port.

14. A directional coupler as recited in claim 1,
further comprising a second signal line connecting the coupling element to a second measuring port to provide the forward or backward signal;
wherein the second signal line comprises a defected ground structure; and
wherein the defected ground structure is inserted between the coupling element and the second measuring port.

15. A directional coupler as recited in claim 1,
wherein the directional coupler comprises a second coupling element and a second signal line connects the second coupling element to a second measuring port to provide the forward or backward signal; and
wherein the second signal line comprises a defected ground structure, wherein the defected ground structure is inserted between the second coupling element and the second measuring port.

16. A directional coupler for providing a forward signal and a backward signal derived from a high-frequency signal, the directional coupler comprising:
a coupling element coupled to a main line, which transports the high-frequency signal; and
a signal line connecting the coupling element to a measuring port to provide the forward signal and the backward signal;
wherein the signal line further comprises a defected ground structure; and
wherein the defected ground structure is inserted between the coupling element and the measuring port.

17. A method for directionally coupling to a main line to provide a forward and/or a backward signal derived from a high-frequency signal, the method comprising:
coupling, via a coupling element, to the main line, which transports the high-frequency signal; and
connecting the coupling element to a measuring port, via a signal line, to provide the forward or backward signal, wherein the signal line further comprises a defected ground structure inserted between the coupling element and the measuring port.

18. A method as recited in claim 17, further comprising:
connecting the coupling element to a second measuring port, via a second signal line, to provide the forward and/or backward signal, wherein the second signal line further comprises a defected ground structure inserted between the coupling element and second the measuring port.

19. A method as recited in claim 17, further comprising:
connecting a second coupling element to a second measuring port, via a second signal line, to provide the forward and/or backward signal, wherein the second signal line comprises a defected ground structure inserted between the second coupling element and the second measuring port.

* * * * *